Figure 1:
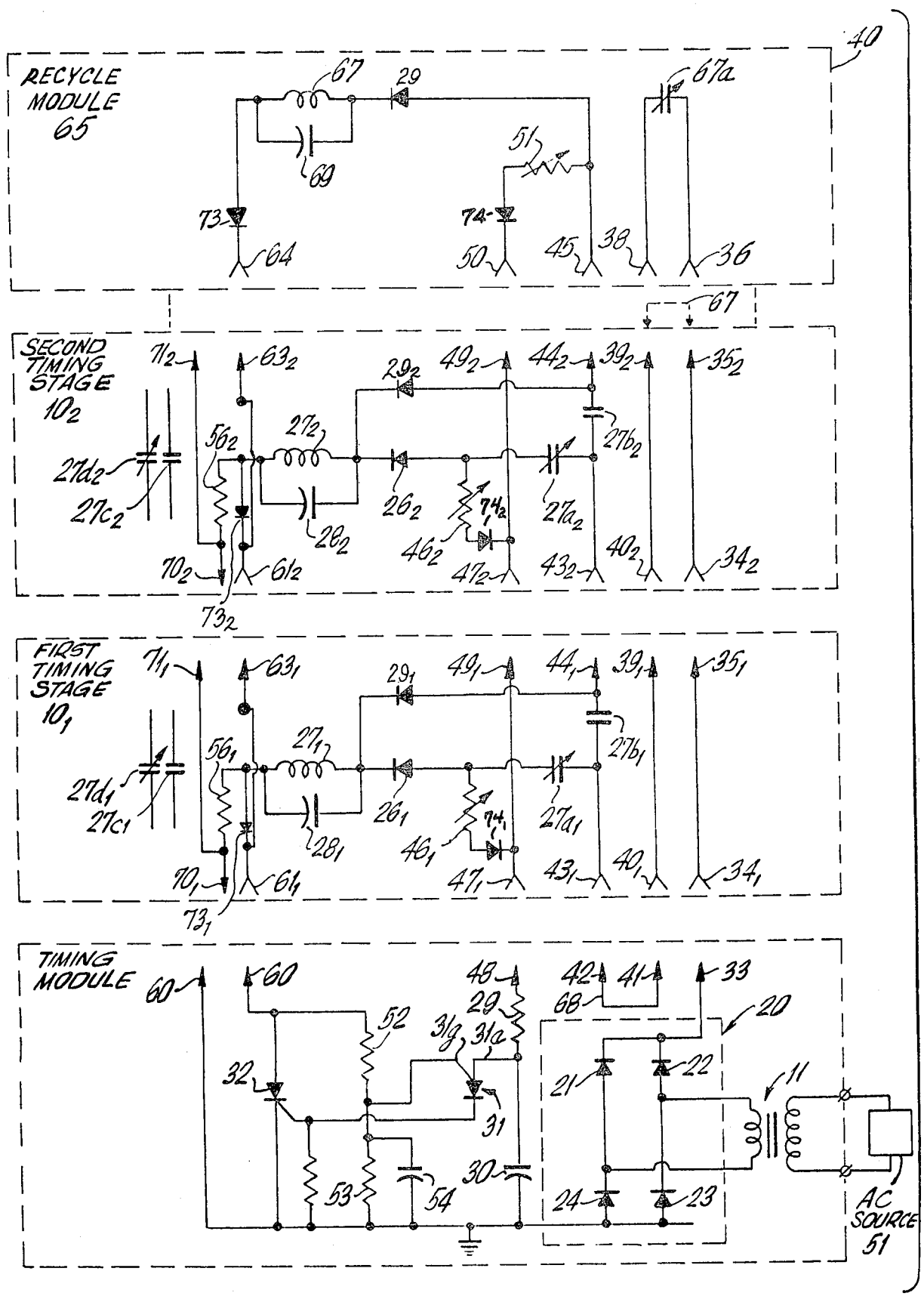

| United States Patent [19] | [11] 4,144,552 |
|---|---|
| Sibalis | [45] Mar. 13, 1979 |

[54] SEQUENTIAL TIMING CIRCUITRY

[76] Inventor: Dan Sibalis, 90 Gold St., New York, N.Y. 10038

[21] Appl. No.: 807,536

[22] Filed: Jun. 17, 1977

Related U.S. Application Data

[63] Continuation-in-part of Ser. No. 789,576, Apr. 21, 1977, abandoned.

[51] Int. Cl.$^2$ .......................................... H01H 47/14
[52] U.S. Cl. .................................... 361/166; 307/293; 361/196
[58] Field of Search ............... 361/166, 167, 196, 198, 361/191, 203, 205; 307/293, 301

[56] References Cited

U.S. PATENT DOCUMENTS

| 3,633,047 | 1/1972 | Kadah et al. ..................... 307/301 X |
| 3,876,914 | 4/1975 | Lukas .................................... 361/196 |
| 4,059,845 | 11/1977 | Kolkman .............................. 361/198 |

Primary Examiner—Patrick R. Salce
Attorney, Agent, or Firm—Stephen B. Judlowe

[57] ABSTRACT

Improved sequential timing circuitry includes a relay coil, normally closed of form C relay contacts and a relay latching element, e.g., a resistor limiting relay coil current to a value intermediate pull-in and holding limit, serially connected to a high ripple D.C. source. A delay circuit selectively gates on a controlled switch to activate the relay, thereby advancing circuit operation to a next sequential task.

In accordance with varying aspects of the present invention, the circuitry of the instant invention may be employed to sequentially excite plural relays with differing delay periods, or to delay turn-on of a master relay, as in a motor control application.

14 Claims, 2 Drawing Figures

SEQUENTIAL TIMING CIRCUITRY

This is a continuation-in-part of my copending application Ser. No. 789,576 filed Apr. 21, 1977 and now abandoned.

DISCLOSURE OF INVENTION

This invention relates to electronic timing apparatus and, more specifically, to improved circuitry for sequentially activating a series of controlled loads, and for effecting a desired delay between a load actuating command and load energization in fact.

It is an object of the present invention to provide improved electronic timer apparatus. More specifically, it is an object of the present invention to provide a reliable, inexpensive, sequencing circuit for energizing plural loads in a defined sequence.

It is a further object of the present invention to provide common circuitry for effecting a desired delay before load energization, for example, to provide an audio, visual warning indication prior to load actuation.

The above and other objects of the present invention are realized in a specific, illustrative sequential timing circuit which includes a non-filtered DC power supply (e.g., half wave or full wave bridge) which supplies current through the coil of a first of an ordered hierarchy of relay actuating windings. The current supplied to the winding is insufficient to actuate the relay, i.e., it is less than the relay pull-in value, but exceeds the relay holding (hold-in) current. The bridge output is also supplied to a timing network, e.g., a cascaded programmable unijunction transistor (PUT) connected in a reflex oscillator configuration, having its output selectively trigger a silicon controlled rectifier (SCR) switch. After the delay effect by the PUT circuit times out, the fired silicon controlled rectifier short circuits a coil current limit impedence thereby actuating this first relay coil, and energizing the first of the controlled loads.

Once actuated, the first relay includes control contacts which clear the delay oscillator and silicon control rectifier, and which also operably connect the second ordered relay coil, such that the delay circuit operates anew (albeit, if desired, with a second, unique time constant) to turn on the second controlled load.

The composite sequential timer repetitively operates in the above described manner, turning on all loads seriatum. Recycling apparatus may be employed depending upon application to clear all controlled relays if cyclic turn on/turn off is desired.

In accordance with one aspect of the present invention, timing/delay circuitry of the kind above described may be employed to effect a desired delay between a load actuation command condition and actual load energization. Such a delay is desired, for example, where an audible and/or visual warning is desired before load actuation, as in a situation of a driven load which is potentially injurious.

Figure 2:
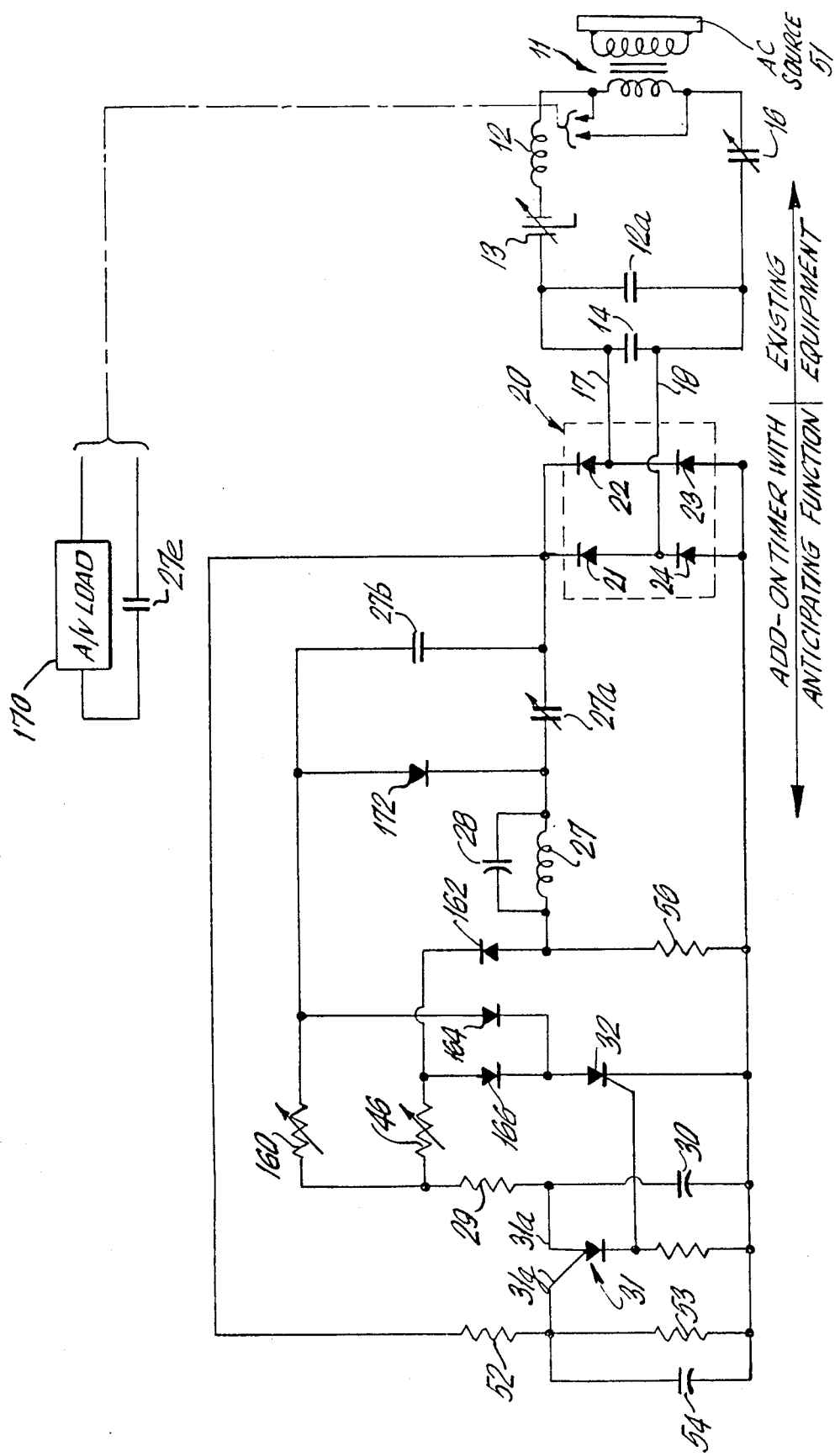

The above and other features and advantages of the present invention will become more clear from the following detailed description of illustrative embodiments thereof, presented herein below in conjunction with the accompanying drawing, in which:

FIG. 1 is a schematic diagram of sequential timing apparatus embodying the principles of the present invention; and FIG. 2 schematically depicts a timer/delay circuit embodying the principles of the present invention to effect a delay between a load actuation command and load actuation in fact.

Referring now to the sequential timing apparatus shown in FIG. 1, there is included a series of relays $27_1$, $27_2, \ldots, 27_n$ which are included in respective timing stages $10_1, 10_2 \ldots, 10_n$ and which are to be sequentially turned on in the order of their subscripts. For concreteness, it will be assumed in the following description that only the two stages $10_1$ and $10_2$ shown are employed (n=2), although any number of cascaded stages may in fact be utilized. Each relay $27_i$ may have any number of load controlling normally open and/or normally closed contacts $27c_i$ and $27d_i$ which are merely shown disconnected in the drawing. Thus, for example, to illustrate one use among many, there are many systems where system supply voltages must be applied in a predetermined sequence, or circuit states initialized, possibly with prescribed delays between supply connections. Thus, the controlled normal opened contacts $27C_1$, $27C_2 \ldots 27C_n$ may be serially connected with the various system voltage source outputs and are sequentially closed to accomplish this desideratum.

Where the relays $27_1, 27_2 \ldots 27_n$ are to stay on once energized, a recycling module 65 shown in the drawing is not employed, and a short circuit jumper 67 connected between the connector ports $35_n$ and $39_n$ of the last timing stage 10, such a short circuit 67 being shown dashed in FIG. 1. It will first be assumed that the recycle module 65 is not employed, and that the jumper 67 is connected as shown, use of the module 65 being discussed below.

Turning now to the functional operation of the FIG. 1 sequential timing circuit, alternating current potential from an AC source 51 is applied via transformer 11 to a bridge circuit 20, e.g., a full wave bridge comprising diodes 21-24 in common timing module 8. Full wave rectified AC current flows out of the bridge power supply 20 through a serpentine path through engaged connectors $33$-$34_1$, $35_1$-$34_2$, $35_2$-jumper $67$-$39_2$, $40_2$-$39_1$, $40_1$-$41$- jumper $68$-$42$-$46_1$, through normally closed contacts $27a$ of relay $27_1$, diode $26_1$, relay coil $27_1$ and to ground through resistor $56_1$ and isolation resistor $73_1$. Normally open contacts $27b_1$ of relay $27_1$ prevent the AC potential from bridge 20 from reaching lower ordered of hierarchial structured timing stages 10. The resistance value of resistance $56_1$ is made sufficiently large so that the current flowing through coil $27_1$ is less than the minimum relay pull-in circuit, i.e., less than the minimum current which will turn the relay $27_1$ on. However, the value of resistance $56_1$ is sufficiently small such that the current through relay $27_1$ exceeds the maximum relay hold-on current.

The potential supplied by the bridge 20, appearing at the left terminal of the normally closed first stage relay contact $27a_1$ is applied as one input to a delay or timing circuit, a programmable unijunction transistor (PUT) timing reflex oscillator being shown. As is per se well known, the anode $31a$ of the PUT 31 is connected to the midpoint of resistance-capacitor charging network comprising adjustable resistors 46, isolation diodes 74 and fixed resistor 29, and capacitor 30. The voltage at the PUT anode $31a$ thus starts from a substantially zero or clear state (zero capacitor storage), and rises at a rate dependent upon the time constant of the elements $46_1$-29, 30. The voltage at the junction of the coil $27_1$ and resistance $56_1$ supplied by engaged connector elements 60 and $61_1$ is applied to a voltage divider network 52-53 in the timing module 8, with a filter capacitor 54 being connected across the divider resistor 53. Accordingly, the gate 31g of the PUT 31 is supplied with a DC potential having a large ripple component. The cathode of the PUT 31 is connected to the gate port of a normally nonconductive silicon controlled rectifier (SCR) 32 having its anode-cathode conduction path connected between the connector 60 and ground.

When the circuit above described is energized, all of the relays $27_1$, $27_2$... are initially unenergized, although holding current flows through the coil $27_1$. Each half cycle for the full wave rectified bridge potential, the negative going transient of the positive PUT gate 31g potential (corresponding to the incompletely filtered raw bridge output) essentially samples the monotonically increasing voltage stored in the capacitor 30. When a sufficient time has elapsed such that the potential across the capacitor 30 is larger than the least positive gate 31g potential during any negative-going AC perturbation, the normal nonconductive PUT 31 fires, discharging capacitor 30 through the gate of the SCR 32 turning it on.

When the SCR 32 fires, it short circuits the resistance $56_1$, thereby applying full supply potential across the coil $27_1$. Such potential charges the capacitor $28_1$ and also gives rise to a more than ample current flow through the coil $27_1$, exceeding its pull-in value, thereby activating the relay $27_1$. The energy stored in capacitor $28_1$ maintains the active state of the coil $27_1$ during the transition period for its contacts. During the transition period, i.e., when the normally closed contacts $27a_1$ are opened but the contact $27b_1$ are not yet closed (so called brake-before-make operation), voltage is removed from the SCR 32 which is thus turned off. After actuation of the relay $27_1$ is completed, holding current for that relay flows through the now engaged contacts $27b_1$ and sneak path inhibiting diode $29_1$ to the coil $27_1$, by-passing diode $26_1$.

The closed contacts $27b_1$ now supply holding (but not pull-in) current to the second stage coil $27_2$ via connectors $44_1$-$43_2$, normally closed contact $27a_2$ and the second stage resistor $56_2$. In a mode of operation directly paralleling that above described, once the PUT timing stage effects a new delay, time out, it again fires the SCR 32 to short circuit the resistance $56_2$, activating the second stage relay $27_2$. It is observed that the time constant for the second timing function, i.e., that associated with the second timing stage $10_2$, employs a resistive R-C network composite resistive element comprising an adjustable resistor $46_2$ and the fixed common current limiting resistor 29, and not the variable resistor $46_1$ associated with the first delay period. That is, the current from the bridge 20 is connected to the capacitor 30 via resistors $46_2$ and 29 through relay contacts $27b_1$ and $27a_2$, while resistance $46_1$ is isolated by now opened contacts $27a_1$ and back-biased diode $26_1$.

The above described operation sequentially continues for each timing stage $10_i$ employed, such that each of the hierarchy of relay coils $27_i$ is energized in turn.

It is sometimes desired to turn the relays $27_1, 27_2...27_n$ on and then to turn all relays off and begin the process again. Such a mode of operation occurs, for example, in actuating varying loads in an operational control or manufacturing process environment. To this end the recycle module 65 is employed as shown, and the jumper 67 removed. Operation of the circuit proceeds in the manner above described, except that when the coil 67 is actuated after a delay period depending upon variable resistance 51, normally closed contacts 67a open thereby removing holding current from all relays 27 thus disabling all such relays and, indeed, all DC energy from the timing module 8. Accordingly, the composite FIG. 1 circuitry begins its sequence of operation anew. It is also observed that while the FIG. 1 arrangement turns all relays 27 on and holds them on, contacts from the relays may be cascaded such that loads controlled by the relay contacts are turned on and off in any sequence, for any desired period, and that a turn on of any one relay may result in a turn off of the loads controlled by any other relay.

Referring now to FIG. 2, there is shown a delay circuit of the kind described above with respect to FIG. 1, but employed to provide a delay in the actuation of a master load controlling relay coil 12. Functional comparable circuit elements in FIG. 2 have been assigned the same reference numerals as depicted in FIG. 1. In particular, with respect to FIG. 2, let it be assumed that the relay coil 12 is a heavy duty relay for actuating a large load, e.g. a garage door or other actuator, and has a relatively large minimum pull-in current. Limit switch 13 comprises normally closed limit switch contacts which are closed except when the garage door is fully closed and normally closed contacts 16 comprise safety contacts, e.g., those of normally closed safety edge relay which open only when the door strikes an impedence in an emergency situation. Normally open contacts 12a of the relay 12 latch the relay 12 on once it is energized, and contacts 14 comprise a "close" manual push button switch which cause direct actuation of the relay 12 when an operator desires to close a door. Thus, in a manual load operation, when the operator depresses the switch 14, current from an AC source through transformer 11 will cause full current to flow through the heavy duty coil 12 through the contacts 14 operating the relay, and causing the door actuator to operate in a direction to close the controlled door. Once actuated, the normally open contacts 12a close, latching the relay 12 on after the "close" push button 14 is released. The motor will stay on until the door fully closes to a position where the limit switch 13 opens (assuming the safety switch 16 senses no impediment as is usually the case).

However, in many applications, it is desired to automatically restore the relay 12-controlled load to a reference position absent any other command. For the assumed garage door controlling context, it is typically desired to close the door to avoid heat loss and secure the controlled area unless the door has been opened to permit ingress or egress. To this end, the FIG. 2 circuitry automatically energizes the coil 12 unless the door is closed (i.e., unless contacts 13 are open) — but after a delay period during the latter part of which an audible and/or visual load element 170 is energized, e.g., a siren and/or light(s), or the like, to give warning that the door is about to close. Thus, for example, after the door has been opened, after the requested delay and warning, the FIG. 2 apparatus will automatically actuate the relay 12 to close the door in the manner now to be described.

To this end, conductors 17 and 18 are wired in parallel with the "close" push button switch 14, and supply AC energy to the bridge 20. Voltage is thus supplied by the transformer 11 from the AC source 51, somewhat (but not substantially) reduced by the impedance of the coil 12 which is of a low impedance by reason of the heavy duty nature of its large load controlling function. It is observed that in accordance with one aspect of the present invention, the impedance of relay coil 12 is substantially smaller than that of the coil 27 employed in the FIG. 2 arrangement.

Output current from the bridge 20, as before, passes through normally closed relay coil 27 contacts 27a, through the coil 27, and to the supply return via resistor 56. The current is limited to exceed hold current, but to be less than pull-in current. The bridge voltage is also supplied to voltage divider 52-53 having a filter capacitor 54 connected in parallel with resistor 53, the divider function being connected to the gate 31g of PUT 31. The PUT anode 31a is actuated by the monotonically increasing voltage across capacitor 30 which charges through a variable resistor 46 and current limiting resistor 29 energized by the coil 27 and a diode 162. During this period of time, the holding current drawn by relay 27, as well as all incidental timing circuit elements, is insufficient as it passes through the load energizing relay coil 12 to energize the relay.

When the capacitor 30 charges to the point where the least positive gate potential during any bridge cycle becomes less than the PUT anode potential, the PUT 31 fires, discharging capacitor 30 through the gate of SCR 32 turning it on. The now conductive SCR 32 substantially short circuits the limiting resistor 56 acting in conjunction with diodes 162 and 166, thereby applying substantially full bridge potential across relay coil 27 and its shunt capacitor 28, activating the relay 27 and charging the capacitor 28. As before, the capacitor 28 maintains the relay active as the relay contacts 27a and 27b change state. The relay coil 27 is thereafter energized by the bridge 20 with holding current passing through the now closed contacts 27b and a diode 172. Also at this time, relay contacts 27e close, applying AC potential (or from the transformer 11) across the audio/-visual load 170 to provide a warning that the relay 12 will fire after a further delay period. At such time, the imminent door closing may be defeated by actuating a conventional "open" or "stop" button as is standard fare and well known to those skilled in the load controlling art. See, for example, my co-pending application Ser. No. 762,271 filed Jan. 25, 1977, the disclosure which is incorporated herein by reference.

After the relay 27 fires (and in the process clears the timing circuits and turns off the SCR 32 in the manner above-described with respect to FIG. 1), the composite PUT relaxation oscillator begins a new timing cycle, employing the variable resistor 160 rather than the previously operatively connected resistor 46. When the PUT oscillator times out, the silicon controlled rectifier 32 again fires. However, for the second conduction of rectifier 32, a short circuit is effectively placed across the output of bridge 20 via the engaged contacts 27b and diode 164. This draws a large current from the transformer 11, turning the relay coil 12 on thereby energizing the ultimate load Once relay 12 fires, its contacts 12a close, thereby short circuiting and clearing the timing circuit connected to the left of the contacts 12a. The load moving motor continues until its end of travel is sensed by limit switch 13 absent any disengagement caused by safety contacts 16.

The above described arrangements have thus been shown to provide an improved timing arrangement which may be employed to effect any desired delay or sequence of delays, and/or which may be employed to effect sequentially timing functions.

The above described arrangements are merely illustrative of the principles of the present invention. Numerous modifications and adaptations thereof will be readily apparent to those skilled in the art without departing from the spirit and scope of the present invention.

What is claimed is:

1. In combination, a source of direct current energy; a relay including a relay actuating coil characterized by a minimum pull-in current required to energize said relay and a maximum holding current required to maintain an already activated relay in an energized state, normally closed relay contacts, relay latching means, said relay latching means, relay coil and normally closed contacts being serially connected and connected to said direct current source, controlled switch means having a control port and a normally nonconductive conduction path connected in parallel with said relay latching means, and delay means connected to said control port of said controlled switch means for energizing said controlled switch means after effecting a timing delay, wherein said relay further includes normally open contacts, and means including said normally open contacts selectively connecting said source of direct current energy with said relay coil.

2. A combination as in claim 1 wherein said source of direct current energy comprises an unfiltered bridge.

3. A combination as in claim 1 further comprising a capacitor connected in parallel with said relay coil.

4. In combination, a source of direct current energy; a relay including a relay actuating coil characterized by a minimum pull-in current required to energize said relay and a maximum holding current required to maintain an already activated relay in an energized state, normally closed relay contacts, relay latching means, said relay latching means, relay coil and normally closed contacts being serially connected and connected to said direct current source, controlled switch means having a control port and a normally nonconductive conduction path connected in parallel with said relay latching means, and delay means connected to said control port of said controlled switch means for energizing said controlled switch means after effecting a timing delay, wherein said controlled switch means comprises a silicon controlled rectifier, and wherein said delay means comprises a relaxation oscillator having a resistance-capacitance timing network and an output connected to the gate terminal of said silicon control rectifier.

5. A combination as in claim 4 wherein said delay means further comprises a programmable unijunction transistor having an anode terminal connected to said resistance-capacitor timing network, a cathode connected to said gate of said silicon control rectifier, and a gate terminal, and a voltage divider having a junction point connected to said gate terminal of said unijunction transistor.

6. A combination as in claim 5 wherein said direct current energy source includes means for supplying a direct current potential having a high ripple content.

7. A combination as in claim 5 wherein said direct current energy source means comprises a full wave diode bridge.

8. In combination, a source of direct current energy; a relay including a relay actuating coil characterized by a minimum pull-in current required to energize said relay and a maximum holding current required to maintain an already activated relay in an energized state, normally closed relay contacts, relay latching means, said relay latching means, relay coil and normally closed contacts being serially connected and connected to said direct current source, controlled switch means having a control port and a normally nonconductive conduction path connected in parallel with said relay latching means, and delay means connected to said control port of said controlled switch means for energizing said controlled switch means after effecting a timing delay, wherein said relay latching means comprises a resistor characterized by resistance value limiting the quiescent current through said relay coil to a value intermediate said minimum pull-in current and maximum holding current.

9. In combination, a source of direct current energy; a relay including a relay actuating coil characterized by a minimum pull-in current required to energize said relay and a maximum holding current required to maintain an already activated relay in an energized state, normally closed relay contacts, relay latching means, said relay latching means, relay coil and normally closed contacts being serially connected and connected to said direct current source, controlled switch means having a control port and a normally nonconductive conduction path connected in parallel with said relay latching means, and delay means connected to said control port of said controlled switch means for energizing said controlled switch means after effecting a timing delay, wherein said relay further includes normally open contacts, and further comprising an additional relay including a relay coil and normally closed contacts, additional relay latching means, said additional relay coil and said normally closed contacts of said additional relay being serially connected together and connected to said normally open contacts of said relay.

10. A combination as in claim 9 wherein said relay latching means and said additional relay latching means comprises first and second resistors.

11. In combination, a source of direct current energy; a relay including a relay actuating coil characterized by a minimum pull-in current required to energize said relay and a maximum holding current required to maintain an already activated relay in an energized state, normally closed relay contacts, relay latching means, said relay latching means, relay coil and normally closed contacts being serially connected and connected to said direct current source, controlled switch means having a control port and a normally nonconductive conduction path connected in parallel with said relay latching means, and delay means connected to said control port of said controlled switch means for energizing said controlled switch means after effecting a timing delay, further comprising a source of alternating current potential, additional relay means including a relay coil and a normally open latching contacts, said coil and said latching contacts of said additional relay being serially connected across said source of alternating current potential, and means connecting said source of direct current energy in parallel with said additional relay latching contacts, said coil of said additional relay being serially connected across said source of alternating current potential, and means connecting said source of direct current energy in parallel with said additional relay latching contacts said coil of said minimum pull-in current of said relay coil.

12. A combination as in claim 11 further comprising means connecting said conduction path of said controlled switch means across the output of said source of direct current energy, thereby activating said additional relay means.

13. A combination as in claim 12 wherein said relay further comprises normally open contacts selectively connecting said relay coil and said controlled switch means with said source of direct current energy.

14. A combination as in claim 11 wherein said relay further includes additional contacts, and alarm signalling means selectively energized by said additional contacts.

* * * * *